United States Patent
Polak et al.

(10) Patent No.: US 11,480,640 B1
(45) Date of Patent: Oct. 25, 2022

(54) SYSTEMS AND METHODS FOR SEPARABLE MOTION ESTIMATION AND CORRECTION USING RAPID THREE-DIMENSIONAL (3D) VOLUMETRIC SCOUT ACQUISITION

(71) Applicants: Siemens Healthcare GmbH, Erlangen (DE); The General Hospital Corporation, Boston, MA (US)

(72) Inventors: Daniel Polak, Blankenbach (DE); Stephen Farman Cauley, Somerville, MA (US)

(73) Assignees: Siemens Healthcare GmbH, Erlangen (DE); The General Hospital Corporation, Boston, MA (US)

( * ) Notice: Subject to any disclaimer, the term of this patent is extended or adjusted under 35 U.S.C. 154(b) by 0 days.

(21) Appl. No.: 17/239,315

(22) Filed: Apr. 23, 2021

(51) Int. Cl.
*G01R 33/54* (2006.01)
*G01R 33/561* (2006.01)
*G01R 33/565* (2006.01)

(52) U.S. Cl.
CPC ........ *G01R 33/543* (2013.01); *G01R 33/5611* (2013.01); *G01R 33/56509* (2013.01)

(58) Field of Classification Search
None
See application file for complete search history.

(56) References Cited

U.S. PATENT DOCUMENTS

| | | | |
|---|---|---|---|
| 2012/0271155 A1* | 10/2012 | Stemmer | G01R 33/5676 600/413 |
| 2020/0364908 A1* | 11/2020 | Li | G06T 11/003 |
| 2021/0373105 A1* | 12/2021 | Polak | G01R 33/56509 |
| 2022/0065971 A1* | 3/2022 | Polak | G01R 33/5608 |

FOREIGN PATENT DOCUMENTS

| | | | | |
|---|---|---|---|---|
| EP | 3581109 A1 | * | 12/2019 | A61B 5/0036 |
| EP | 3581109 A1 | | 12/2019 | |
| WO | 2017092973 A1 | | 6/2017 | |
| WO | WO-2017092973 A1 | * | 6/2017 | G01R 33/561 |

OTHER PUBLICATIONS

M. W. Haskell et al. "TArgeted Motion Estimation and Reduction (TAMER): Data consistency based motion mitigation for mri using a reduced model joint optimization," IEEE Trans. Med. Imaging, vol. 37, No. 5, pp. 1253 1265, 2018.
A. Loktyushin et al., "Blind multirigid retrospective motion correction of MR images," Magn. Reson. Med., 2015.

(Continued)

*Primary Examiner* — Rodney E Fuller
(74) *Attorney, Agent, or Firm* — Banner & Witcoff Ltd.

(57) ABSTRACT

In a method and system for reducing motion artifacts in magnetic resonance image data, a scout scan (e.g. a three-dimensional (3D) scout scan) of the region of the patient is performed, a magnetic resonance (MR) measurement of the region of the patient is performed to acquire two-dimensional (2D) MR image data of the region of the patient, and motion correction is performed on the acquired 2D MR image data based on the scout scan to generate corrected MR image data. The motion correction technique advantageously reduces an influence of a patient motion on the magnetic resonance image data.

19 Claims, 7 Drawing Sheets

(56) References Cited

OTHER PUBLICATIONS

L. Cordero-Grande, et al., "Sensitivity Encoding for Aligned Multishot Magnetic Resonance Reconstruction," IEEE Trans. Comput. Imaging, 2016.

D. Atkinson et al., "Automatic correction of motion artifacts in magnetic resonance images using an entropy focus criterion," IEEE Trans. Med. Imaging, 1997.

L. Cordero-Grande et al., "Three-dimensional motion corrected sensitivity encoding reconstruction for multi-slice MRI: Application to neonatal brain imaging," Magn. Reson. Med., 2018.

M. W. Haskell et al., "Network Accelerated Motion Estimation and Reduction (NAMER): Convolutional neural network guided retrospective motion correction using a separable motion model," Magn. Reson. Med., vol. 82, No. 4, pp. 1452-1461, 2019.

D. Gallichan et al., "Retrospective correction of involuntary microscopic head movement using highly accelerated fat image navigators (3D FatNavs) at 7T,"Magn. Reson. Med., 2016.

R. Bammer et al., "Augmented generalised SENSE reconstruction to correct for rigid body motion," Magn. Reson. Med., 2007.

M. D. Tisdall et al., "Volumetric navigators for prospective motion correction and selective reacquisition in neuroanatomical MRI," Magnetic Resonance in Medicine, 2012.

B. Bilgic et al., Wave-CAIPI for highly accelerated 3D imaging, Magn. Reson. Med., vol. 73, No. 6, pp. 2152 2162, 2015.

L. Cordero-Grande et al., "Motion corrected MRI with DISORDER: Distributed and Incoherent Sample Orders for Reconstruction Deblurring using Encoding Redundancy," Oct. 2019.

D. Polak et al., Wave-CAIPI for highly accelerated MP.

D. Polak et al., "Highly-accelerated volumetric brain protocol using optimized wave-CAIPI encoding," in Proc. Intl. Soc. Mag. Res. Med., 2018, p. 0937.

D. Polak, S. Cauley, D. Splitthoff, P. Bachert, and K. Setsompop, "Scout Acquisition enables rapid Motion Estimation (SAME) for fully separable retrospective motion mitigation," in Proceedings of ISMRM 28th Annual Meeting, 2020.

A. Loktyushin et al., "Blind Multirigid retrospective motion correction of MR images," Magn. Reson. Med., 73:1457-1468, 2015.

Larkman, David J., et al. "Use of Multicoil Arrays for Separation of Signal from Multiple Slices Simultaneously Excited", Journal of Magnetic Resonance Imaging, vol. 13, pp. 313-317; 2001.

\* cited by examiner

Optimization of scout acquisition

3D volumetric SPACE scout acquisitions

1x1x1 mm³, R=4

1x4x4 mm³, R=4

1x4x4 mm³, R=12

Estimated motion using various 3D SPACE scouts

Motion dataset constructed from three 2D TSE scans acquired with intra-scan motion

SYSTEMS AND METHODS FOR SEPARABLE MOTION ESTIMATION AND CORRECTION USING RAPID THREE-DIMENSIONAL (3D) VOLUMETRIC SCOUT ACQUISITION

BACKGROUND

Field

The disclosure relates to systems and methods for reducing motion artifacts in magnetic resonance image data acquired from a patient using a scout scan, including for two-dimensional (2D) Turbo-Spin-Echo (TSE) imaging.

Related Art

Navigator-free retrospective motion correction techniques may solve a coupled optimization problem where the data-consistency error of a SENSE (SENSitivity Encoding)+ motion model is minimized with respect to the unknown motion parameters and an image estimate "jointly" as illustrated in FIG. 1. For example, Navigator-free retrospective motion correction techniques may perform image reconstruction by solving:

$$\min_{\vec{\theta}} \min_{x} \left\| \sum M_i F C T_{\theta_i} R_{\theta_i} x - k_i \right\|_2$$

where ki denotes the multi-channel k-space data of shot i, x is the image, $T\theta_i R\theta_i$ is the shot-dependent translation and rotation motions, C is the coil sensitivity, F is the Fourier transformation, and Mi is the undersampling mask. All shots are coupled in this inverse problem and the non-convex estimation of several hundreds of temporal motion parameters is computationally demanding. That is, this technique poses a computationally demanding non-convex inverse problem with several hundred temporal motion parameters and millions of imaging voxels.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

Figure 1:
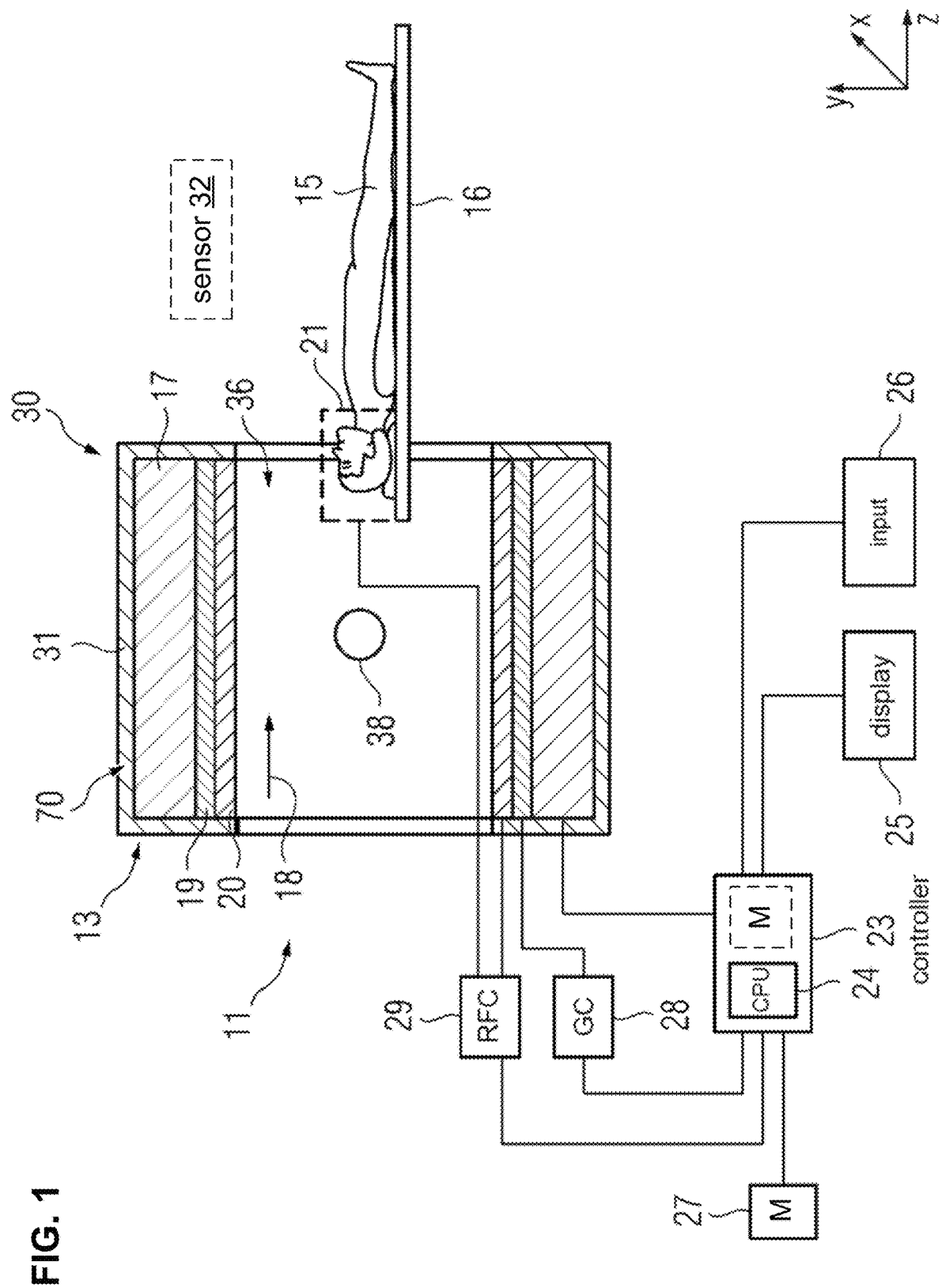
FIG. 1 is a schematic representation of a magnetic resonance imaging system according to an exemplary embodiment of the disclosure.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

An object of the disclosure is to reduce an influence of patient motion on magnetic resonance image data.

In one or more aspects, the scout scan technique is based on Scout Acquisition enables rapid Motion Estimation and Reduction (SAMER). Examples of SAMER are described in U.S. Provisional Patent Application No. 63/031,760, filed May 29, 2020, and U.S. patent application Ser. No. 17/239,161, filed Apr. 23, 2021, claiming priority thereto, titled "SCOUT ACQUISITION ENABLES RAPID MOTION ESTIMATION AND REDUCTION (SAMER) SYSTEMS AND METHODS FOR RETROSPECTIVE MOTION MITIGATION." Each of these applications is incorporated herein by reference in its entirety.

Figure 3:
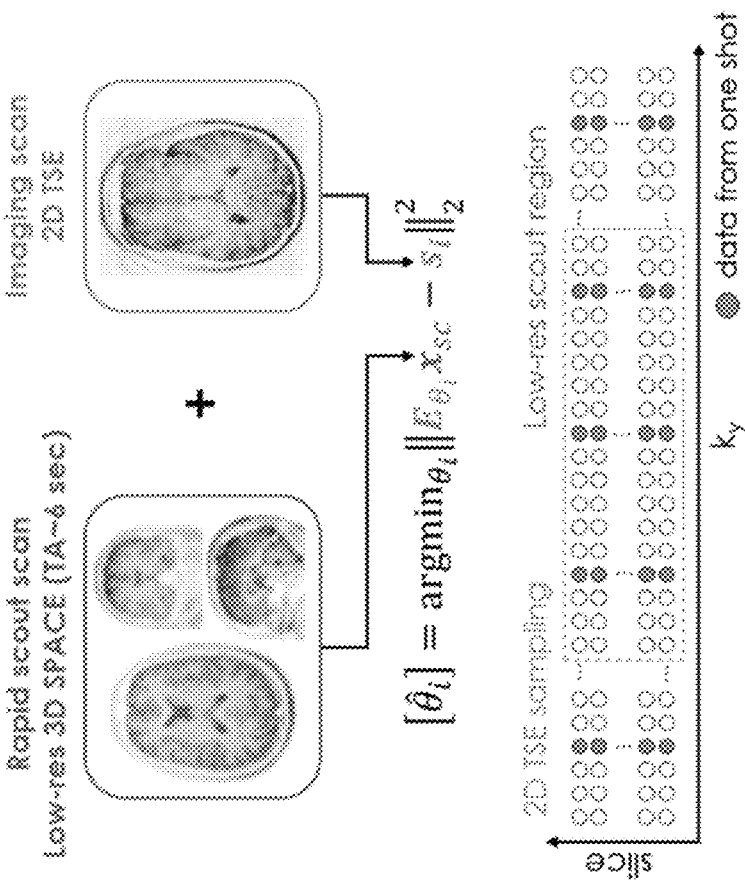
FIG. 3 illustrates an example SAMER optimization according to exemplary embodiments of the disclosure.

SAMER decouples motion estimation from the image reconstruction and avoids the computationally demanding repeated updates of an image estimate as shown in FIG. 3. In addition, the SAMER decouples the motion states themselves leading to a highly scalable computational solution. For example, alternating optimization is computationally demanding as repeated updates of the motion vector and image estimate are needed. However, SAMER speeds up the optimization by utilizing a scout scan as an image prior. This avoids the need for repeated updates of the imaging volume during the motion estimation.

2D slice-by-slice imaging may be used as the imaging technique for clinical brain imaging. In exemplary aspects of the disclosure, scout scan motion mitigation, such as SAMER, is extended from 3D volumetric imaging to 3D volumetric reconstructions of 2D TSE imaging data. That is, SAMER is extended to 2D TSE imaging and motion parameters are estimated from, e.g., a low-resolution SPACE (Sampling Perfection with Application optimized Contrasts using different flip angle Evolution) scout scan. In one or more other embodiments, the scout scan is a 3D volumetric scout scan. The scout scan is not limited to 3D scout scans and the scout scan can be a 2D scout scan in one or more embodiments. As illustrated in FIG. 3, each shot of the imaging scan (pink circles) has common frequency overlap with the low-resolution scout (dashed blue box).

Figure 4:
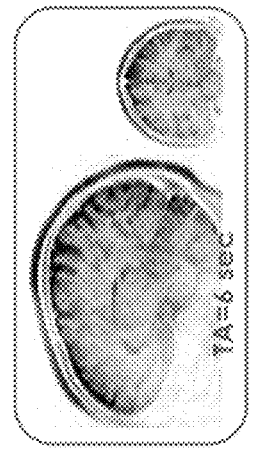
FIG. 4 illustrates examples of 3D scout acquisitions according to exemplary embodiments of the disclosure.
Figure 4:
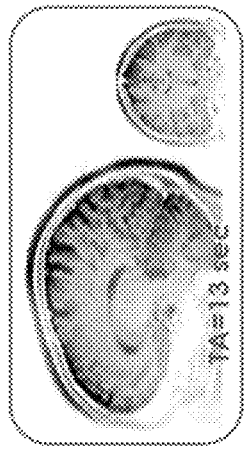
Figure 4:
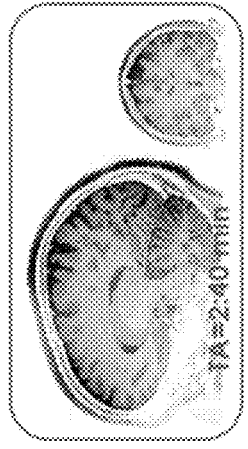
Figure 4:
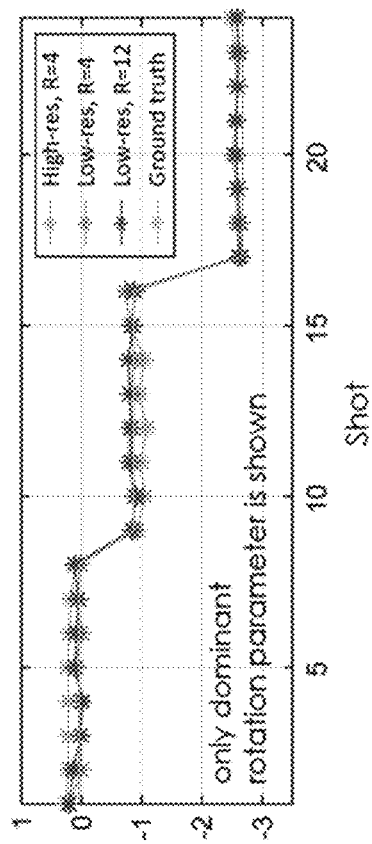
Figure 4:
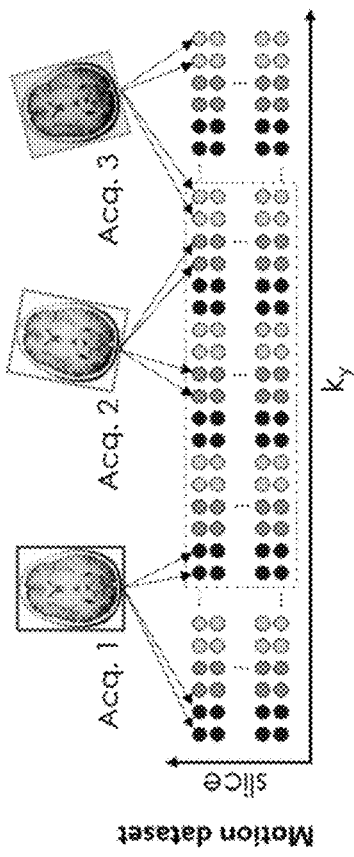

In one or more embodiments of the disclosure, a very rapid scout scan is used to achieve accurate motion estimation in 2D imaging data. The scout scan can also be of a low-resolution (e.g. as compared to the image scan). In one or more aspects, the scout scan is a 3D volumetric SPACE (Sampling Perfection with Application optimized Contrasts using different flip angle Evolution) scan as illustrated in FIG. 4. The scout acquisition may be optimized to achieve accurate motion estimation with minimal added scan time. In an exemplary aspect, the 3D volumetric scan (e.g., 3D SPACE) is used to estimate 3D motion in 2D imaging data. Advantageously, a 3D scout scan provides volumetric imaging data without having to compensate for slice gaps to improve accuracy. A 2D acquisition is still possible, but may provide a lower accuracy motion estimation. In exemplary aspects, to minimize the scan time of the scout scan, data is acquired at low spatial resolution and with parallel imaging acceleration.

Figure 5:
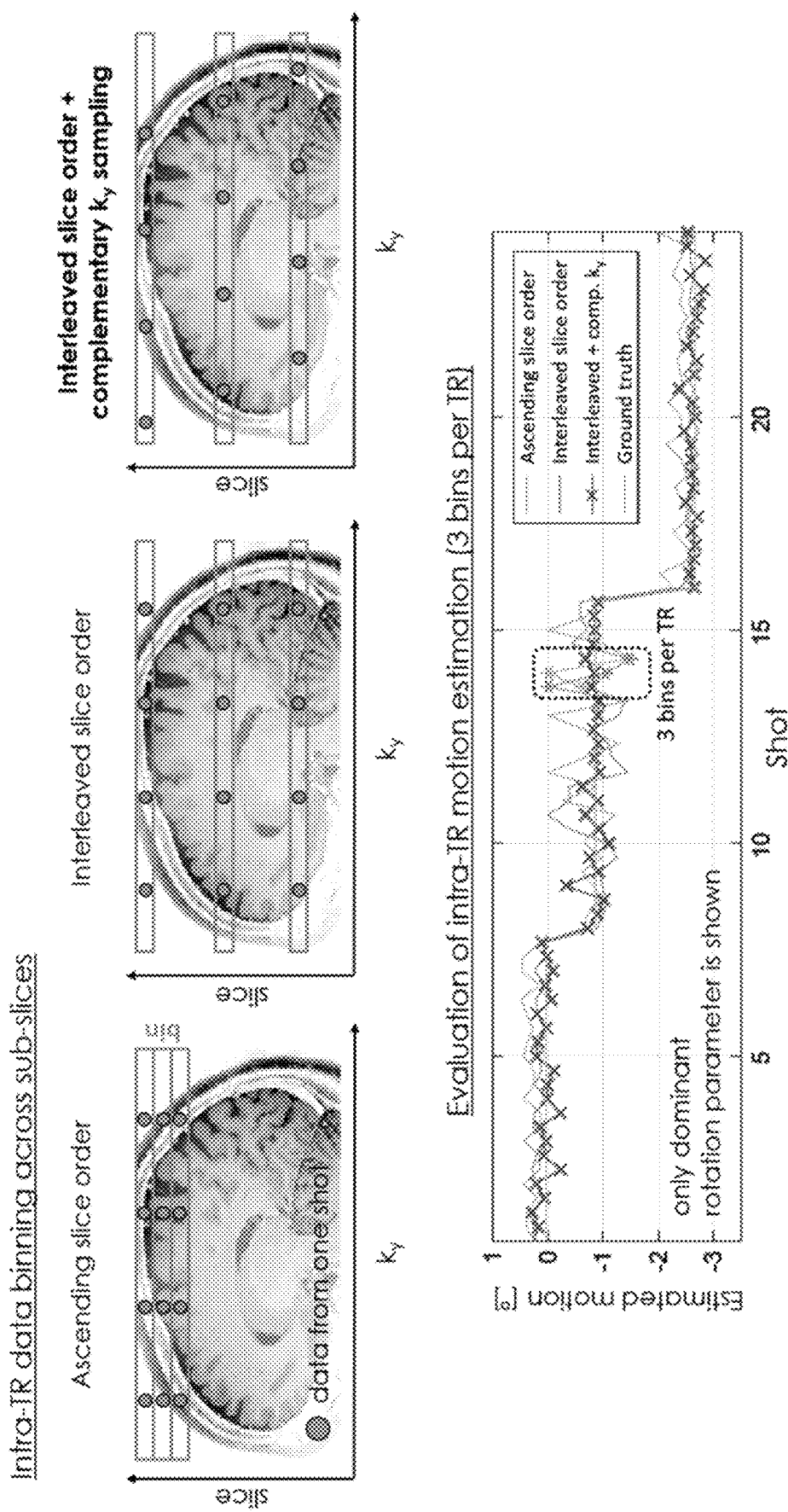
FIG. 5 illustrates example 2D TSE sampling and intra-shot motion estimations according to exemplary embodiments of the disclosure.

Methods and systems according to exemplary embodiments may include a 2D TSE slice ordering scheme to increase the temporal resolution of the motion estimation while maintaining the clinically desired contrast. In an exemplary embodiment, the data-binning strategy allowed motion estimation every two seconds. An evaluation for a standard clinical T2w 2D TSE imaging sequence is shown in FIG. 5. In this example, Intra-TR data binning with standard ascending slice ordering may produce in inaccurate motion estimation. However, an interleaved slice ordering with complementary $k_y$ sampling where the k-space samples in each bin are more homogenously distributed across the slice-$k_y$-space better preserved the estimation accuracy as illustrated in FIG. 5.

Figure 6:
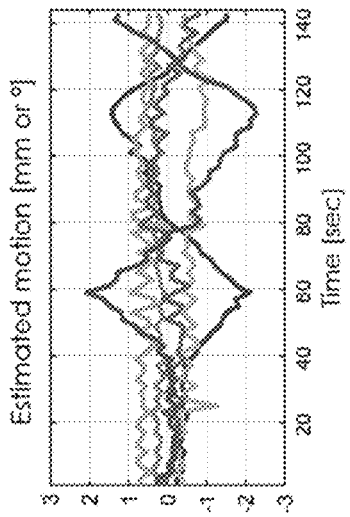
FIG. 6 illustrates example motion correction images and data for axial TSE according to exemplary embodiments of the disclosure.
Figure 6:
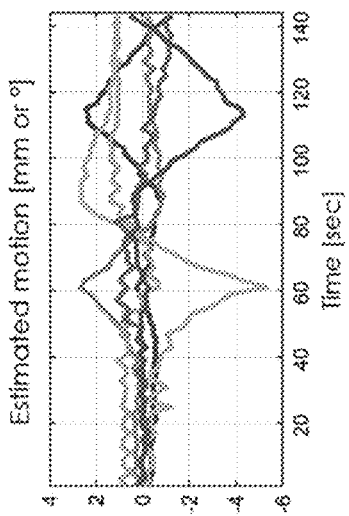

In exemplary embodiments, a framework for full 3D motion estimation and correction of 2D TSE imaging data is provided. As illustrated in FIG. 6, this framework allows very rapid estimation and correction of rigid body motion. SAMER may provide 3D motion estimation and correction for 2D imaging data. In an exemplary embodiment, SAMER is employed using a full 3D image reconstruction model. In this example, image interpolation is used to transform 2D slice-by-slice data to 3D volumetric data (and vice versa). In other aspects, a simpler 2D model may be used with the tradeoff of a possible reduced reconstruction performance (e.g. in the presence of through-plane motion). As shown in FIG. 6, in Acquisition 1 (mostly in-plane rotation), SAMER mitigated most motion artifacts, which allowed fine anatomical structures, such as a blood vessel to be recovered (see blue arrows in the zoomed-in portions). The image quality improvement is also reflected by a decrease in data-consistency error (DC). In Acquisition 2 (through-plane rotation), SAMER also yielded robust artifact reduction (see teal arrow in the respective zoomed portions).

Figure 7:
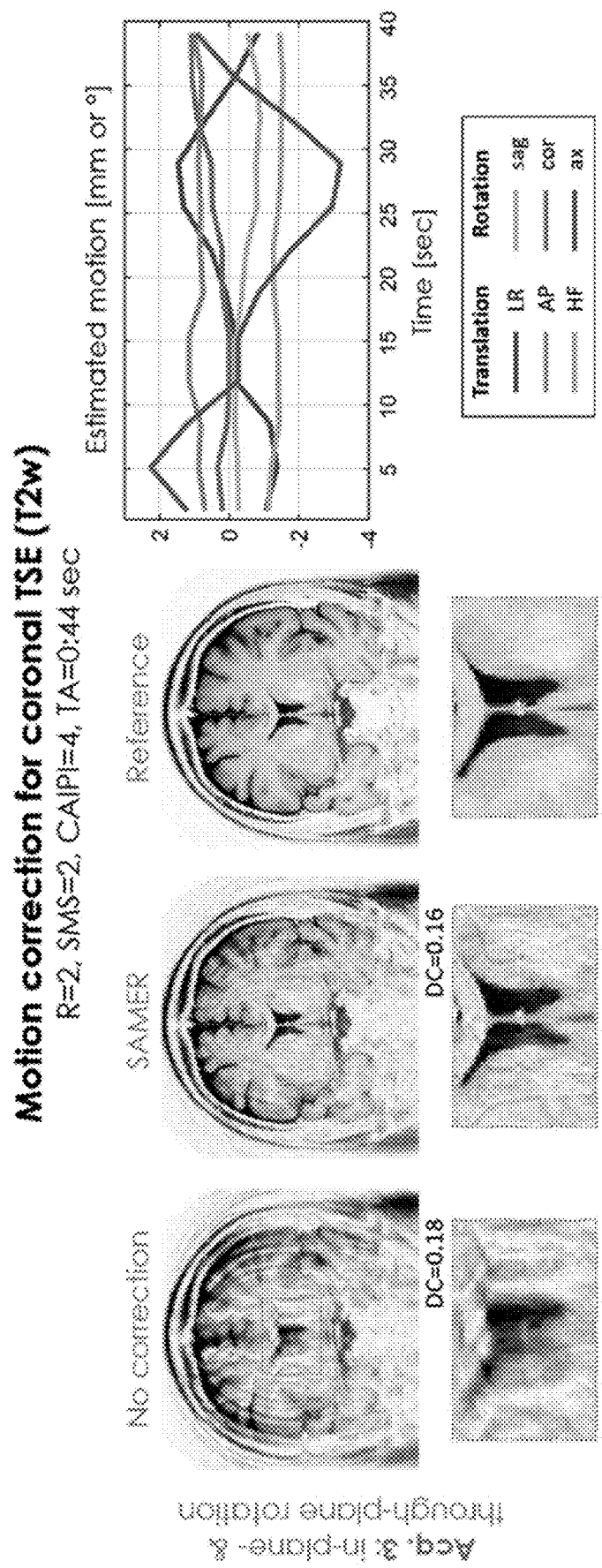
FIG. 7 illustrates example motion correction images and data for coronal TSE according to exemplary embodiments of the disclosure.

In exemplary embodiments, the motion correction framework is extended to highly accelerated Simultaneous Multi-slice (SMS) acquisitions to achieve very rapid motion-robust imaging. In an exemplary embodiment, the SENSE+motion forward model is adapted to extend the SAMER motion correction to SMS. The SENSE+motion forward model is described in Haskell et al., "TArgeted Motion Estimation and Reduction (TAMER): Data Consistency Based Motion Mitigation for MRI Using a Reduced Model Joint Optimization," IEEE Transactions on Medical Imaging, vol. 37, no. 5, pp. 1253-1265, May 2018, which is incorporated herein by reference in its entirety. As illustrated in FIG. 7, SAMER enabled substantial image quality improvement in a highly accelerated 2D TSE acquisition with Simultaneous Multi-Slice. The zoom-in shows increased image sharpness, as demonstrated for a blood vessel (blue arrow). The teal-colored arrows so that some residual high-frequency ringing artifacts may be present, but the image quality is nonetheless advantageously improved.

The disclosure includes methods to reduce motion artifacts in magnetic resonance image data acquired from a patient, including for two-dimensional (2D) Turbo-Spin-Echo (TSE) imaging using a three-dimensional (3D) volumetric scout scan. A motion artifact may represent any blurring, streaking, smearing and/or shading, as well as diffuse image noise and/or ghosting in magnetic resonance images caused by a movement of the patient during a magnetic resonance measurement. The movement may include voluntary and/or involuntary movement. Examples for common patient movements are, amongst others, tilting or turning a head, blinking, swallowing, rolling an eye, respiratory motion, etc.

In a method according to an exemplary embodiment, the patient is positioned in an imaging region of a magnetic resonance imaging device configured to perform a magnetic resonance measurement of the region (e.g. head) of the patient. An imaging region may represent a volume where the patient is positioned to perform a magnetic resonance measurement of the patient. The imaging region is at least partially encompassed by a magnetic field generator of the magnetic resonance imaging device. For example, the imaging region may be confined by the magnetic field generator in at least one spatial direction, at least two spatial directions or at least three spatial directions. It is also conceivable that the imaging region is encompassed by the magnetic field generator in a circumferential direction. The magnetic field generator may be configured to provide a homogenous, static magnetic field (B0-field), a magnetic gradient field and/or a high frequency magnetic field (B1-field) inside the imaging region of the magnetic resonance imaging device. In an exemplary embodiment, the magnetic field generator is configured to provide an imaging volume within the imaging region. The imaging volume may be characterized by a particularly homogenous magnetic field or an approximately linear magnetic gradient field. The imaging volume may be an isocenter of the magnetic resonance imaging device. In an exemplary embodiment, the dimension of the imaging volume may correspond to a dimension of the diagnostically relevant area. It is conceivable that the magnetic resonance imaging device encloses at least a part of the head of the patient when the patient is positioned in the imaging region. Positioning the head of the patient in the imaging region may involve locking the head of the patient in a predefined relative position to the magnetic resonance imaging device. For example, the magnetic resonance imaging device may comprise adjustable mechanical elements and/or fasteners configured to fix the head of the patient in a predefined position. The fixing of the anatomy (e.g. head) of the patient prevents the head from moving during the magnetic resonance measurement.

The method may include performing the magnetic resonance measurement to acquire magnetic resonance image data of the head region of the patient. A magnetic resonance measurement may include performing an imaging sequence that may be characterized by one or more imaging parameters. The imaging parameter(s) may determine, for example, a size and/or position of the imaging volume, a property and/or temporal succession of the magnetic gradient field and/or the high frequency magnetic field, as well as a time for readout of magnetic resonance signals from the imaging volume. Examples for commonly used imaging parameters are a repetition time, an echo time, a field of view, a spatial resolution and the like. In an exemplary embodiment, the imaging sequence is configured to provide a high signal intensity or a bright contrast of the diagnostically relevant area of the patient. For example, the imaging sequence may include an echo time accounting for the T2-relaxation time associated with the anatomical region of interest (e.g. brain) of the patient.

In an exemplary embodiment, the method includes performance of a motion correction process during the magnetic resonance measurement. The motion correction process advantageously reduces an influence of a patient motion on the magnetic resonance image data. The method may also include mechanically limiting or restricting the motion of the patient. For example, the magnetic resonance imaging device may include a mechanical means, such as a fastener, which is configured to arrest the head of the patient in a predefined position in order to limit a movement of the patient's head.

However, the motion correction technique may also comprise techniques for determining and/or quantifying a motion of the patient during the magnetic resonance measurement. In particular, the motion correction may comprise techniques for correcting acquired magnetic resonance image data based on a determined and/or quantified patient motion. This concept is referred to as retrospective correction of the magnetic resonance image data. It is also conceivable, that the motion correction technique comprises adjusting imaging parameters of an imaging sequence in real-time during the magnetic resonance measurement in order to prospectively correct the acquired magnetic resonance image data. The patient motion may be determined by employing a sensor, such as a motion sensor and/or an optical sensor, which is configured to acquire information on a movement of the patient during the magnetic resonance measurement. The motion correction technique may further comprise using algorithms, particularly image processing algorithms, configured to compensate for patient movement by processing or manipulating the acquired magnetic resonance image data or the reconstructed magnetic resonance images in dependence of information acquired via the sensor.

By reducing an influence of a patient motion on the magnetic resonance image data, an occurrence of motion artifacts in magnetic resonance images can advantageously be reduced or avoided. Thus, a quality of magnetic resonance images can be increased and a risk for misdiagnosis of magnetic resonance images and/or a need for repetition of the magnetic resonance measurement can advantageously be decreased.

The magnetic resonance imaging system according to an exemplary embodiment includes a magnetic resonance imaging device (i.e. scanner) and a controller (with may include a processor) that is configured to control the scanner and execute the methods of the present disclosure. In order to acquire, process and/or store data, such as magnetic resonance image data and/or motion data, the controller may include processor circuitry and internal and/or external memory, as well as a suitable interface configured to transmit and receive data and/or convert data into a desired data format. The controller may include a microcontroller, processor (e.g. CPU, GPU) and/or other processor circuitry. The controller may also include an internal memory and/or access an external memory. The internal and/or external memory may include any well-known memory or computer storage medium such as, for example, a RAM, ROM, PROM, EPROM, EEPROM, flash memory, as well as an HDD, an SSD and the like. However, the processor may also have access to an external data storage, i.e. an external server or a cloud storage, connected to the processor via a suitable network connection. The data may be transported between components via analog and/or digital signals using suitable signal connections. The magnetic resonance imaging system may further comprise at least one motion sensor and/or at least one optical sensor configured to determine and/or quantify a movement of a patient positioned in an imaging region of the magnetic resonance imaging device. In an exemplary embodiment, the at least one motion sensor and/or the at least one optical sensor are configured to transmit motion data and/or optical image data to the processor via a suitable signal connection. It is conceivable, that the processor is configured to quantify a movement of the patient in dependence of the motion data and/or the optical image according to an embodiment of the inventive method described above. The processor may further be configured to adjust an imaging parameter of a current magnetic resonance measurement and/or to correct a reconstruction of magnetic resonance image data in dependence of the motion data and/or the optical image data in order to account for a movement of the patient during the magnetic resonance measurement. It is also conceivable, that the processor is configured to acquire a projection image and/or navigator data of the facial region of the patient by means of the magnetic resonance imaging device.

In an exemplary embodiment, the magnetic resonance device is a dedicated scanner configured to acquire magnetic resonance image data of a specific body region of the patient, but is not limited thereto. For example, the magnetic resonance imaging device may be configured to perform a magnetic resonance measurement of the head (e.g. brain) of the patient. Thus, an imaging volume of the magnetic resonance imaging device may be tailored to match a diagnostically relevant area, such as the brain of the patient. Particularly, the imaging region of the dedicated scanner may be configured to match the specific body region of the patient.

In providing a processor configured to correct for a movement of the patient in dependence of motion data and, a quality of magnetic resonance image data acquired from brain of the patient can be increased advantageously.

The computer program product according to exemplary embodiments can be loaded into a memory of a programmable processor of a magnetic resonance imaging system. The computer program product may include executable program code that when executed by a processor of the magnetic resonance imaging system, causes the magnetic resonance imaging system to perform a method according to the disclosure. As a result, the method according to the disclosure can be carried out quickly, and in a robust and repeatable manner. The computer program product is configured in such a way that it can carry out the method steps according to the disclosure by the processor.

The computer program product is, for example, stored on a computer-readable medium or stored on a network, a server or a cloud, from where it can be loaded into the processor of a local processor. The local processor can be directly connected to the magnetic resonance imaging system or designed as part of the magnetic resonance imaging system. Furthermore, control information of the computer program product can be stored on an electronically readable medium. The control information on the electronically readable medium can be designed in such a way that, when the medium is used, it carries out a method according to the disclosure in a processor of the magnetic resonance imaging system. The electronically readable medium is a memory, such as a DVD, a magnetic tape, or a USB stick on which electronically readable control information (e.g. software) is stored. This control information may be read from the medium and stored in a controller and/or processor of a magnetic resonance imaging system.

FIG. 1 illustrates a magnetic resonance imaging (MRI) system 11 according to an exemplary embodiment of the disclosure. The magnetic resonance imaging system 11 includes a magnetic resonance (MR) device (MR scanner) 13 with a static field magnet 17 that provides a homogenous, static magnetic field 18 (BO field). The static magnetic field 18 includes an isocenter 38 and a cylindrical imaging region 36 for receiving a patient 15. The imaging region 36 is surrounded by the magnet arrangement 30 in a circumferential direction. The patient support 16 is configured to transport the patient 15 into the imaging region 36. In particular, the patient support 16 may transport a diagnostically relevant region of the patient 15 into an imaging volume defined by the isocenter 38 of the magnetic resonance imaging device 13. The magnetic resonance device 13 may be screened from an environment by a housing shell 31.

The magnetic resonance device 13 further includes a gradient magnet arrangement 19 configured to provide magnetic gradient fields used for spatial encoding of magnetic resonance signals during the magnetic resonance measurement. The gradient magnet arrangement 19 is activated by a gradient controller 28 via an appropriate current signal.

The magnetic resonance device 13 further includes a radiofrequency antenna 20 (body coil), which may be integrated into the magnetic resonance device 13. The radiofrequency antenna 20 is operated via a radiofrequency controller 29 that controls the radiofrequency antenna 20 to generate a high frequency magnetic field and emit radiofrequency excitation pulses into an examination space, which is essentially formed by the imaging region 36. The magnetic resonance imaging system 11 may further includes a local coil 21, which is positioned on or in proximity to the diagnostically relevant region (e.g. head) of the patient 15. The local coil 21 may be configured to emit radiofrequency excitation pulses into the patient 15 and/or receive magnetic resonance signals from the patient 15. It is conceivable, that the local coil 21 is controlled via the radiofrequency controller 29.

The magnetic resonance imaging system 11 further includes a controller 23 configured to control the magnetic resonance imaging system 11. In an exemplary embodiment, the controller 23 is configured to control the MRI device 13 to perform MR measurements, perform one or more scout scans, and perform motion-correction processing on MR image data based on the scout scan. In an exemplary embodiment, the controller 23 is configured to control the scanner 13 to perform MR measurements to obtain two-dimensional (2D) image data and perform one or more motion-correction processing using a three-dimensional (3D) volumetric scout scan. In one or more embodiments, the controller 23 controls the scanner 13 to perform Turbo-Spin-Echo (TSE) imaging to obtain the 2D image data. In an exemplary embodiment, the controller 23 is configured to perform image interpolation to transform 2D slice-by-slice data to 3D volumetric data (and vice versa). The controller 23 may generate one or more MR images based on the MR image data acquired from the MR measurement(s), which may include generating MR images based on MR image data that has been subjected to motion correction. The controller 23 may output the MR image(s) to be displayed on a display (output unit 25) and/or output a computer data signal corresponding to the MR image(s). The MR image(s) may be stored in the memory 27.

The controller 23 may include a processor 24 configured to process magnetic resonance signals and reconstruct magnetic resonance images. The processor 24 may also be configured to process input from a user of the magnetic resonance imaging device 13 and/or provide an output to the user. For this purpose, the processor 24 and/or the controller 23 can be connected to an output unit 25 (e.g. display, touchscreen, speaker) and an input unit 26 (e.g. keyboard, mouse, touchscreen) via a suitable signal connection. For a preparation of a magnetic resonance measurement, preparatory information, such as imaging parameters or patient information, can be provided to the user via the output unit 25. The input unit 26 may be configured to receive information and/or imaging parameters from the user. The output unit 25 and the input unit 26 may also be implemented as a combined interface, such as a touch-screen interface. In an exemplary embodiment, the controller 23 includes processor circuitry that is configured to perform one or more functions and/or operations of the controller 23, including controlling the MR imaging system 11 and/or the MR device 13, processing magnetic resonance signals, reconstructing magnetic resonance images, controlling the MRI device 13 to perform MR measurements and/or perform one or more scout scans, performing motion-correction processing, processing input from the user of the magnetic resonance imaging device 13 and/or providing an output to the user.

In an exemplary embodiment, the controller 23 also include an internal and/or external memory 27. The internal and/or external memory 27 may include any well-known memory or computer storage medium. The memory 27 may store any data or information, such as patient data, image data, image models, control information, image parameters. The data or information may be provided by the input unit 26, read from the scanner 13 (or other component(s) of the system), and/or other source as would be understood by one of ordinary skill in the art.

As will be appreciated by one of ordinary skill, the magnetic resonance imaging system 11 may include further conventional imaging system components, but have been omitted herein for brevity.

Figure 2:
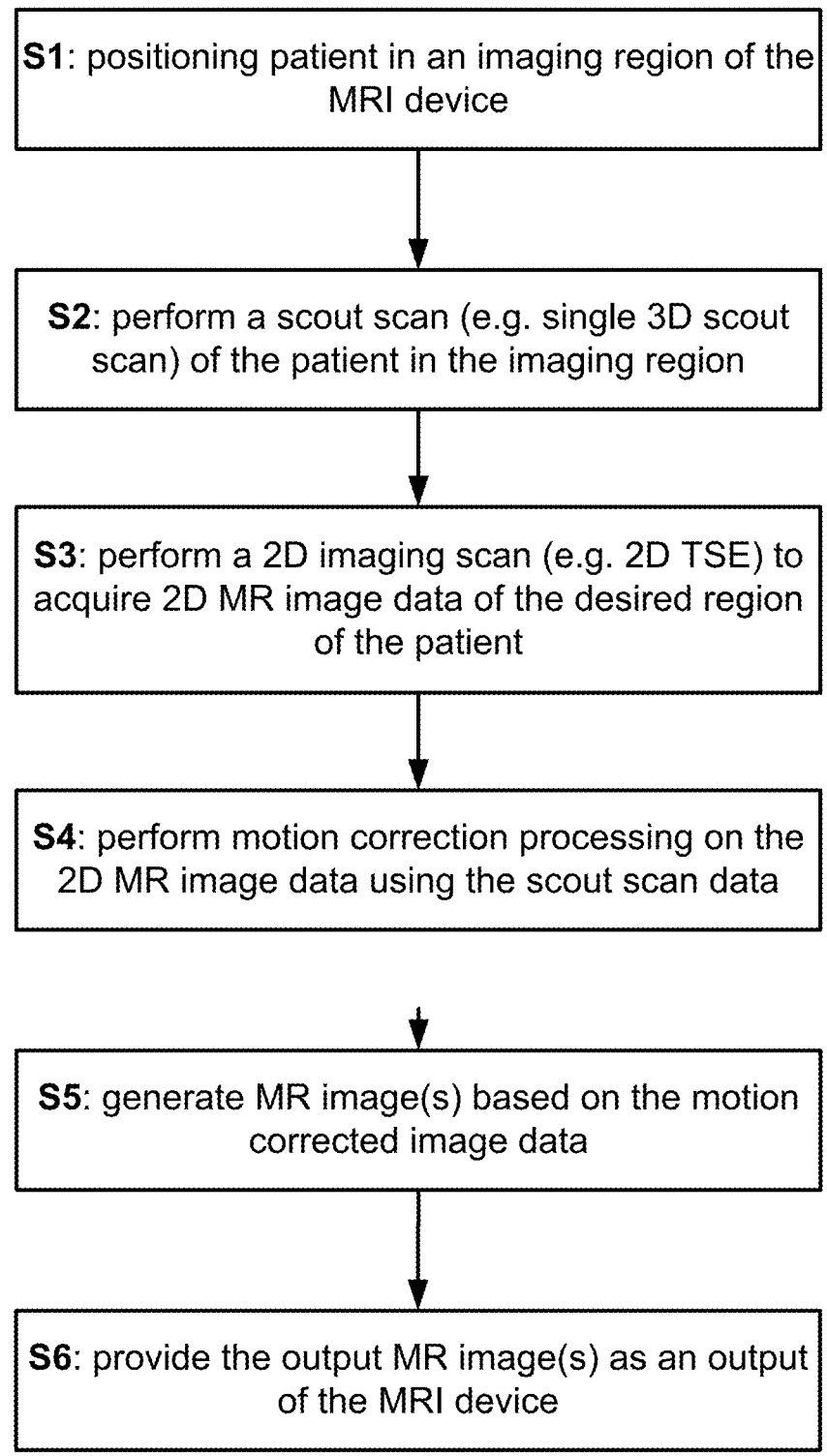
FIG. 2 is a flowchart of a method for reducing motion artifacts according to an exemplary embodiment of the disclosure.

In an exemplary embodiment, the MRI system 11 is configured to use SAMER techniques to reduce motion artifacts in acquired magnetic resonance image data. In an exemplary embodiment, a very rapid scout scan is used to achieve accurate motion estimation in 2D imaging data while the scout scan is a 3D volumetric SPACE (Sampling Perfection with Application optimized Contrasts using different flip angle Evolution) scan as illustrated in FIG. 2. For example, 2D TSE slice ordering scheme may be used that increases the temporal resolution of the motion estimation while maintaining the clinically desired contrast. In exemplary embodiments, a framework for full 3D motion estimation and correction of 2D TSE imaging data is provided. As illustrated in FIG. 6, this allowed very rapid estimation and correction of rigid body motion. In exemplary embodiments, the motion correction framework is extended to highly accelerated Simultaneous Multi-slice (SMS) acquisitions to achieve very rapid motion-robust imaging. For example, as illustrated in FIG. 7, SAMER enabled substantial image quality improvement in a highly accelerated 2D TSE acquisition with Simultaneous Multi-Slice.

As discussed above, SAMER may use a single, rapid 3D volumetric scout scan $\hat{x}$ to drastically reduce the computation cost for navigation-free retrospective motion-correction of 2D imaging data (e.g. 2D TSE). In an exemplary embodiment, the single, rapid scout scan has a duration of, for example, $T_{add}$=3 sec, but is not limited thereto.

By employing this single rapid scout scan, the computation cost of motion-estimation is advantageously reduced in the 2D imaging data. This advantageously extends the motion estimation to imaging techniques that utilize 2D TSE slice ordering schemes.

FIG. 2 depicts a flowchart of an inventive method for reducing motion artifacts in magnetic resonance image data acquired from a region of the patient 15. Although aspects of the disclosure describe magnetic resonance image data being acquired from the brain of the patient 15, the present disclosure is not limited thereto and aspects of the disclosure can apply to other regions of the patient 15 as would be understood by one of ordinary skill in the art.

In step S1, the patient 15 is positioned in an imaging region 36 of the magnetic resonance imaging device 13 configured to perform a magnetic resonance measurement of the patient 15. For this purpose, the patient 15 may be positioned on the patient support 16, which is configured to carry the patient 15 into the imaging region 16 either automatically or based on a control instruction provided by a user of the magnetic resonance imaging device 13. As shown in FIG. 2, the magnetic resonance imaging device 13 may also be configured such that the patient 15 is able to autonomously enter the imaging region 36. It is also conceivable, that the magnet arrangement 30 of the magnetic resonance imaging device 13 is positioned relative to the patient 15 in order to match the isocenter 38 with a diagnostically relevant region. In an exemplary embodiment where the region of interest of the patient 15 is the brain of the patient 15, when positioning the patient 15 in the imaging region 36, at least the head of the patient 15 may be supported and/or fixed in a support device to reduce a movement of the patient 15 during the magnetic resonance measurement.

In step S2, the SAMER (scout acquisition enables rapid motion estimation and reduction) technique is employed to reduce motion artifacts in magnetic resonance image data. In an exemplary embodiment, a single, rapid 3D volumetric scout scan of the region of the patient 15 is performed in the SAMER process. In an exemplary embodiment, the single, rapid scout scan has a duration of, for example, $T_{add}$=3 sec, but is not limited thereto. Although aspects are described with having only a single scout scan, the disclosure is not limited thereto and aspects can include one or more additional scout scans. However, as would be appreciated by one of ordinary skill in the art, the additional scout scans would increase the overall scan time.

In an exemplary embodiment, the scout scan is of a lower resolution than the resolution used in the magnetic resonance measurement performed to acquire magnetic resonance image data of the region of the patient 15 (Step S3). For example, the scout scan can have a 1×4×4 mm³ resolution and R=9 to minimize additional scan time, but are not limited thereto.

In an exemplary embodiment, dummy shots within the magnetic resonance imaging sequence can be omitted such that the imaging sequence directly follows the scout scan. For example, the scout scan can be performed in place of dummy shots within the magnetic resonance measurement sequence. Further, the dummy shots within the scout scan may be additionally or alternatively omitted. The removal of the dummy shots optimizes the scout acquisition by minimizing the added scan time. This also eliminates the need for scout reacquisition across the clinical exam where several imaging contrasts are acquired.

In step S3, a magnetic resonance measurement is performed to acquire magnetic resonance image data of the region of the patient 15. Acquiring magnetic resonance image data may include performing at least one imaging sequence dedicated to the brain or a specific region of the brain of the patient 15. In an exemplary embodiment, the magnetic resonance measurement acquires 2D image data. In this example, the scanner 13 can perform a 2D imaging scan, such as a 2DTurbo-Spin-Echo (TSE) imaging sequence to obtain the 2D image data.

In an exemplary embodiment, performing the magnetic resonance measurement may include acquiring separate magnetic resonance image data from different portions of the brain of the patient 15. For this purpose, a plurality of imaging sequences, such as at least two imaging sequences, may be performed. It is conceivable that imaging parameters of the at least two imaging sequences are adjusted to enhance a signal intensity, a signal-to-noise ratio, a resolution and/or an acquisition time of magnetic resonance image data of the brain.

In step S4, a motion correction technique is employed based on the scout scan. The motion correction technique reduces an influence of a patient motion on the magnetic resonance image data.

In an exemplary embodiment, the inter-scan motion is estimated based using the motion-free scout scan ($\hat{x}$). In an exemplary embodiment, the inter-scan motion is estimated by minimizing the below equation:

$$\min_{\overrightarrow{\theta_i}} \| M_i F C T_{\theta_i} R_{\theta_i} \hat{x} - k_i \|_2$$

where $k_i$ denotes the multi-channel k-space data of shot i, $T_{\theta i} R_{\theta i}$ is the shot-dependent translation and rotation motions, C is the coil sensitivity, F is the Fourier transformation, $M_i$ is the undersampling mask, and $\hat{x}$ is the motion-free 3D scout scan. In an exemplary embodiment, the motion estimation with respect to the 3D scout scan is performed for each shot of the acquired MR image data, which leads to identical motion-estimates across all shots.

In an exemplary embodiment, the motion correction processing includes image interpolation to transform 2D slice-by-slice data to 3D volumetric data (and vice versa). In this example, the interpolation converts 2D slice-by-slice data of the 2D MR image data to 3D volumetric data and/or converts 3D volumetric data of the 3D scout scan to 2D slice-by-slice data. In an exemplary embodiment, a stack of the 2D slices are treated as a 3D volume and a full 3D reconstruction is performed based on this volume to reduce motion artifacts from through-plane motion.

In an exemplary embodiment, the motion correction technique includes a prospective and/or retrospective correction of the magnetic resonance image data using the scout scan. The motion correction technique may include performing a separate correction of the acquired magnetic resonance image data based on a respective motion state or relative position of the patient 15. For this purpose, the individual k-space-lines may be transferred to an image space before correction. To compensate for rotational movement of the head of the patient 15, non-Cartesian reconstruction methods may be applied. Non-Cartesian reconstruction methods may include, for example, reconstructing using a SENSE+ motion forward model (image space) or gridding/NUFFT (Non-uniform fast Fourier transform) for reconstructing in k-space. Other non-Cartesian reconstruction methods may be used as would be understood by one of ordinary skill in the art.

In an exemplary embodiment, the motion correction technique includes positioning a motion sensor on the region of interest and determining a displacement of the motion sensor due to motion of the patient 15 while performing the magnetic resonance measurement. Due to movement of the patient 15, the position of the diagnostically relevant region may vary within the imaging region 36. The movement of the patient 15 may cause a translative movement detected the motion sensor 32. The motion correction technique may include a prospective and/or retrospective correction of the magnetic resonance image data based on the displacement of the sensor 32. In order to compensate for the translative movement, the frequency and/or phase of the radiofrequency excitation pulse emitted via the radiofrequency antenna 20 is adjusted in real-time in such a way, that the imaging volume tracks the diagnostically relevant region of the patient 15 during the magnetic resonance measurement. In a similar fashion, the sensor 32 may also detect a rotational movement of the patient's head. In this case, an encoding gradient of the imaging sequence may be rotated in order to account for the detected movement.

In an exemplary embodiment, the motion correction technique includes employing an optical sensor 32 to acquire optical image data of the patient while performing the magnetic resonance measurement and a prospective and/or retrospective correction of the magnetic resonance image data based on the optical image data. As described above, the processor 24 may be configured to derive motion data of the patient 15 in dependence of optical image data acquired via the sensor 32. The motion data may be used to adjust a field of view, a slice center and/or an excitation pulse frequency for a next acquired k-space line in real-time during the magnetic resonance measurement. For example, encoding gradients of the imaging sequence may be rotated in accordance with a rotational movement of the patient's head, whereas a translational movement may be accounted for by changing a frequency of the radiofrequency excitation pulse. However, the motion data may also be fed back to an image reconstruction algorithm in order to correct the magnetic resonance image data for motion of the patient retrospectively. As described above, this may comprise applying a phase change to the acquired magnetic resonance image data in order to compensate for translational motion and/or applying non-Cartesian reconstruction methods for correcting rotational motion.

In step S5, one or more MR images is generated based on the motion-corrected image data provided by the motion-correction processing. For example, the controller 23 may generate the motion-corrected image data based on the 2D image data and the 3D scout scan.

In step S6, the MR image(s) are output from the MRI system 11 (e.g. from controller 23). The images may be, for example, displayed on a display (output unit 25), stored in memory 27, output as a computer data signal, or the like.

The embodiments described above are to be recognized as examples. Individual embodiments may be extended by features of other embodiments. In particular, a sequence of the steps of the inventive methods are to be understood as exemplary. The individual steps can also be carried out in a different order or overlap partially or completely in time.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than those shown or described here. In addition, the terms "comprise" and "have" and any variants thereof are intended to cover non-exclusive inclusion. For example, a process, method, system, product or equipment comprising a series of steps or modules or units is not necessarily limited to those steps or modules or units which are clearly listed, but may comprise other steps or modules or units which are not clearly listed or are intrinsic to such processes, methods, products or equipment.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

For the purposes of this discussion, the term "processor circuitry" shall be understood to be circuit(s), processor(s), logic, or a combination thereof. A circuit includes an analog circuit, a digital circuit, state machine logic, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A method for reducing motion artifacts in magnetic resonance image data acquired from a region of a patient using a magnetic resonance imaging (MRI) device, the method comprising:
   performing a scout scan of the region of the patient;
   performing a magnetic resonance (MR) measurement of the region of the patient to acquire two-dimensional (2D) MR image data of the region of the patient, the MR measurement including adjusting a slice acquisition order; and
   performing motion correction on the acquired 2D MR image data based on the scout scan to generate corrected MR image data, the motion correction including performing intra-shot data binning, wherein the motion correction reduces an influence of a patient motion on the MR image data.

2. The method according to claim 1, wherein MR measurement comprises a Turbo-Spin-Echo (TSE) measurement sequence.

3. The method according to claim 1, wherein the scout scan is a three-dimensional (3D) scout scan.

4. The method according to claim 1, wherein the motion correction comprises estimating motion parameters based on the scout scan for each shot of the 2D MR measurement.

5. The method according to claim 4, further comprising optimizing a data consistency error of a SENSE+motion forward model based on the scout scan to estimate the motion parameters.

6. The method according to claim 1, wherein the motion correction comprises converting 2D slice-by-slice data of the 2D MR image data to 3D volumetric data and/or converting the 3D volumetric data of the 3D scout scan to 2D slice-by-slice data.

7. The method according to claim 1, further comprising generating one or more MR images based on the corrected MR image data.

8. The method according to claim 1, further comprising outputting the corrected MR image data as a computer data signal.

9. The method according to claim 1, wherein performing the scout scan of the region of the patient comprises performing a single scout scan of the region of the patient.

10. The method according to claim 1, wherein the scout scan has a lower resolution than a resolution of the MR measurement.

11. The method according to claim 10, wherein the performance of the scout scan comprises performing parallel imaging to reduce a time duration of the scout scan.

12. The method according to claim 1, wherein the scout scan has a duration that does not exceed 3 seconds.

13. The method according to claim 1, further comprising positioning the patient in an imaging region of the MRI device configured to perform the MR measurement of the region of the patient.

14. A non-transitory computer-readable storage medium with an executable program stored thereon, that when executed, instructs a processor of a magnetic resonance imaging (MRI) device to perform a method for reducing motion artifacts in magnetic resonance image data acquired from a region of a patient, the method comprising:
   performing a scout scan of the region of the patient;
   performing a magnetic resonance (MR) measurement of the region of the patient to acquire two-dimensional (2D) MR image data of the region of the patient, the MR measurement including adjusting a slice acquisition order; and
   performing motion correction on the acquired 2D MR image data based on the scout scan to generate corrected MR image data, the motion correction including performing intra-shot data binning, wherein the motion correction reduces an influence of a patient motion on the MR image data.

15. A magnetic resonance imaging (MRI) system, comprising:
   a magnetic resonance (MR) scanner configured to perform a magnetic resonance (MR) measurement of a patient; and
   a controller that is configured to:
     control the MR scanner to perform a scout scan of the region of the patient;
     control the MR scanner to perform a magnetic resonance (MR) measurement of the region of the patient to acquire two-dimensional (2D) MR image data of the region of the patient, the measurement including adjusting a slice acquisition order; and
     perform motion correction on the acquired 2D MR image data based on the scout scan to generate corrected MR image data, the motion correction including performing intra-shot data binning, wherein the motion correction reduces an influence of a patient motion on the MR image data.

16. The MRI system according to claim 15, wherein the MR scanner further comprises a patient support, the controller being further configured to control the patient support to position the patient in an imaging region of the MRI device.

17. The MRI system according to claim 15, wherein MR measurement comprises a Turbo-Spin-Echo (TSE) measurement sequence.

18. The MRI system according to claim 15, wherein performing the scout scan of the region of the patient comprises performing a single scout scan of the region of the patient.

19. The MRI system according to claim 15, wherein the scout scan is a three-dimensional (3D) scout scan.

* * * * *